United States Patent
Tsai et al.

(10) Patent No.: US 11,723,144 B2
(45) Date of Patent: Aug. 8, 2023

(54) ELECTRONIC DEVICE AND CIRCUIT BOARD THEREOF

(71) Applicant: SILICONWARE PRECISION INDUSTRIES CO., LTD., Taichung (TW)

(72) Inventors: Ming-Fan Tsai, Taichung (TW);
Chih-Wei Chen, Taichung (TW);
Chien-Cheng Lin, Taichung (TW);
Chao-Ya Yang, Taichung (TW);
Chia-Yang Chen, Taichung (TW)

(73) Assignee: SILICONWARE PRECISION INDUSTRIES CO., LTD., Taichung (TW)

(*) Notice: Subject to any disclaimer, the term of this patent is extended or adjusted under 35 U.S.C. 154(b) by 44 days.

(21) Appl. No.: 17/465,335

(22) Filed: Sep. 2, 2021

(65) Prior Publication Data
US 2022/0225493 A1    Jul. 14, 2022

(30) Foreign Application Priority Data
Jan. 13, 2021   (TW) .................................. 110101291

(51) Int. Cl.
*H05K 1/02* (2006.01)

(52) U.S. Cl.
CPC . *H05K 1/0225* (2013.01); *H05K 2201/10098* (2013.01)

(58) Field of Classification Search
CPC .................. H05K 1/0225; H05K 2201/10098
See application file for complete search history.

(56) References Cited

U.S. PATENT DOCUMENTS

| | | | |
|---|---|---|---|
| 2013/0201074 A1* | 8/2013 | Harper | H01Q 1/243 343/866 |
| 2019/0223287 A1* | 7/2019 | Nishida | H05K 5/0069 |
| 2021/0328334 A1* | 10/2021 | Cooper | H01Q 1/526 |
| 2022/0077586 A1* | 3/2022 | Jeong | H01Q 1/526 |

* cited by examiner

*Primary Examiner* — Hoa C Nguyen
(74) *Attorney, Agent, or Firm* — Kelly & Kelley, LLP

(57) ABSTRACT

An electronic device is provided, in which an antenna module for receiving and transmitting radiation signals is disposed on a mounting surface of a circuit board, and an inner layer of the circuit board is formed with a ground surface to arrange a strip-shaped ground circuit along the edges of the ground surface so that the ground circuit occupies at most 50% of the area of the ground surface to improve antenna radiation efficiency.

4 Claims, 6 Drawing Sheets

ELECTRONIC DEVICE AND CIRCUIT BOARD THEREOF

BACKGROUND

1. Technical Field

The present disclosure relates to an antenna device, and more particularly, to an electronic device having an antenna module and a circuit board thereof.

2. Description of Related Art

The wireless communication technology has been widely used in various consumer electronic products (such as mobile phones, tablet computers, etc.) to facilitate the reception or transmission of various wireless signals. In order to meet the requirements of portability for consumer electronic products and the convenience for Internet access (such as watching multimedia content), the manufacture and design of wireless communication modules are developed towards the needs of light, thin, and compact. For instance, patch antenna is widely used in wireless communication modules of electronic products due to its small size, light weight and easy manufacturing.

As shown in FIG. 1, in a conventional electronic device 1, an antenna module 1b is disposed on a mounting surface S of an outer layer structure 10' of a circuit board 1a (e.g., a printed circuit board or PCB), and an antenna ground plate 11 electrically connected to the antenna module 1b is disposed on a base layer structure 10 of the circuit board 1a, where the outer layer structure 10' is disposed on the base layer structure 10. As such, the antenna ground plate 11 is formed inside the circuit board 1a.

However, in the conventional electronic device 1, when the antenna module 1b is designed to be miniaturized, the antenna radiation efficiency of the antenna module 1b would decrease, resulting in a reduction in the operating efficiency of the electronic device 1, and thus shortening the signal transmission distance of the electronic device 1.

Therefore, how to overcome the above-described drawbacks of the prior art has become an urgent issue in the art.

SUMMARY

In view of the above-described drawbacks of the prior art, the present disclosure provides a circuit board, which comprises: a circuit board body having an inner layer surface serving as a ground surface; a strip-shaped ground circuit arranged in the circuit board body along edges of the ground surface, wherein the ground circuit occupies at most 50% of an area of the ground surface.

In the above-described circuit board, the ground circuit includes at least one annular body. In an example, the annular body has a gap. Further, the ground surface is a polygon, and the gap is located at a corner of the ground surface.

The present disclosure further provides an electronic device, which comprises: the aforementioned circuit board, wherein an outer surface of the circuit board is served as a mounting surface; and an antenna module disposed on the mounting surface of the circuit board body and electrically connected to the ground circuit, wherein the antenna module is configured to receive and transmit radiation signals.

In the above-described electronic device, a location of the antenna module on the circuit board is different from a location of the gap.

In the above-described electronic device, the mounting surface is in a polygon form, and the antenna module is located at a corner of the mounting surface.

Therefore, in the electronic device and the circuit board thereof according to the present disclosure, the strip-shaped ground circuit is arranged on the circuit board body along the edges of the ground surface, and the ground circuit occupies at most 50% of the area of the ground surface to improve antenna radiation efficiency of the antenna module, such that the antenna module can continue to be miniaturized and the antenna radiation efficiency can still meet the requirements.

BRIEF DESCRIPTION OF THE DRAWINGS

FIG. 2-1 is a schematic perspective view of an electronic device according to the present disclosure.

FIG. 2-2 is a schematic upper plan view showing another aspect of FIG. 2-1.

DETAILED DESCRIPTION

The following illustrative embodiments are provided to illustrate the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "on," "a," etc., are merely for illustrative purposes and should not be construed to limit the scope of the present disclosure.

Figure 1:
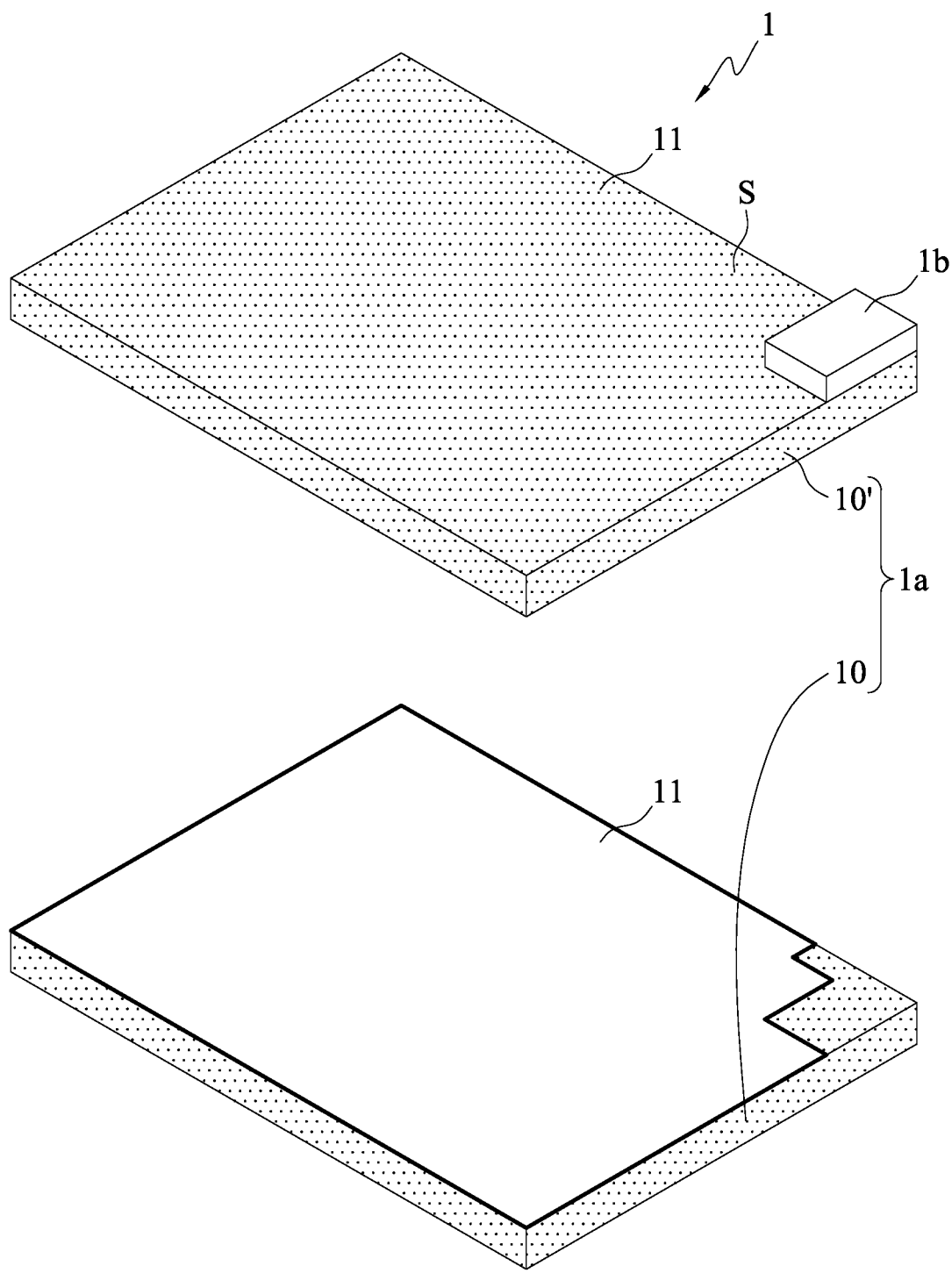
FIG. 1 is a schematic cross-sectional view of a conventional electronic device.
Figures 1, 2:
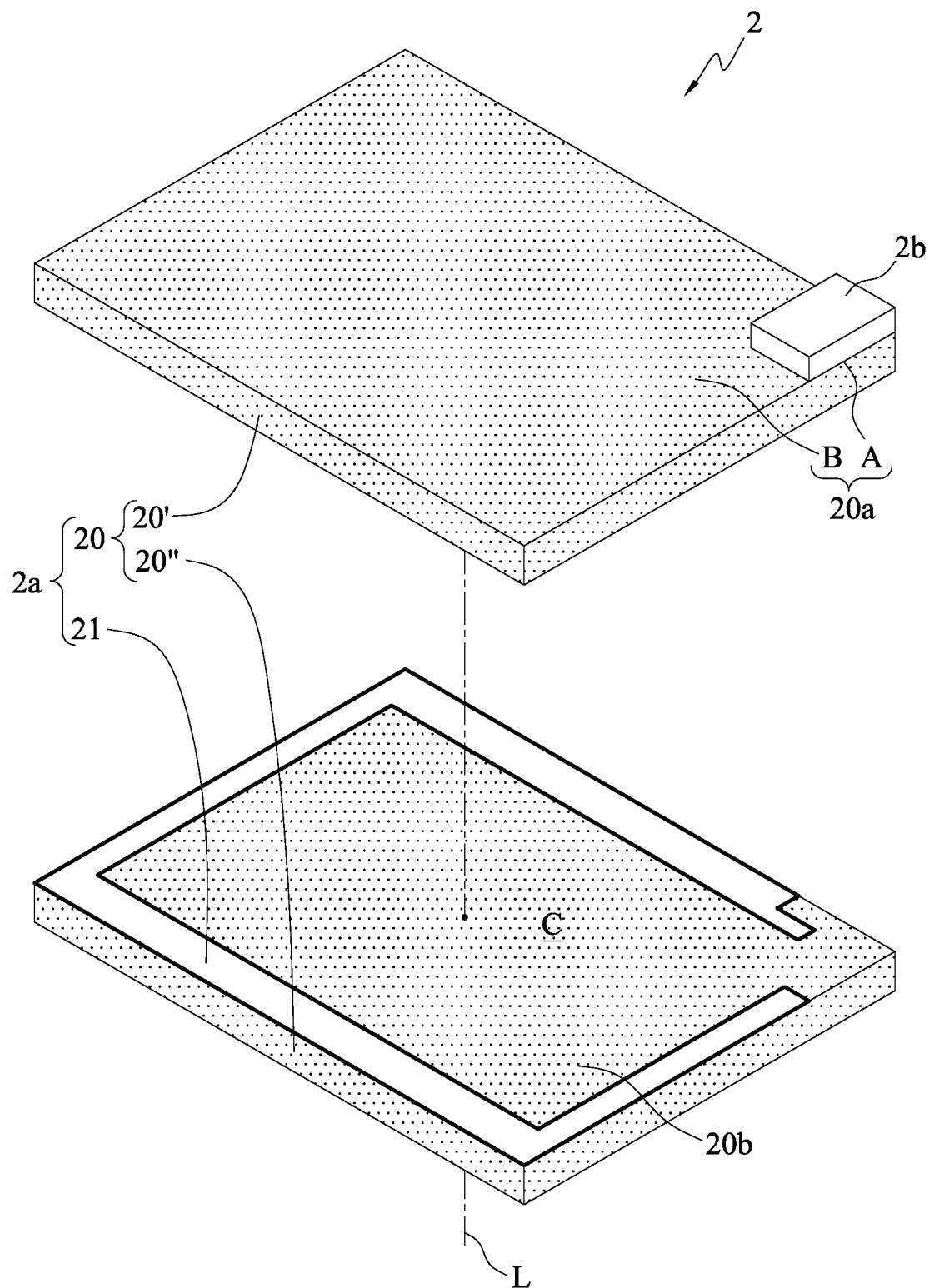
Figure 2:
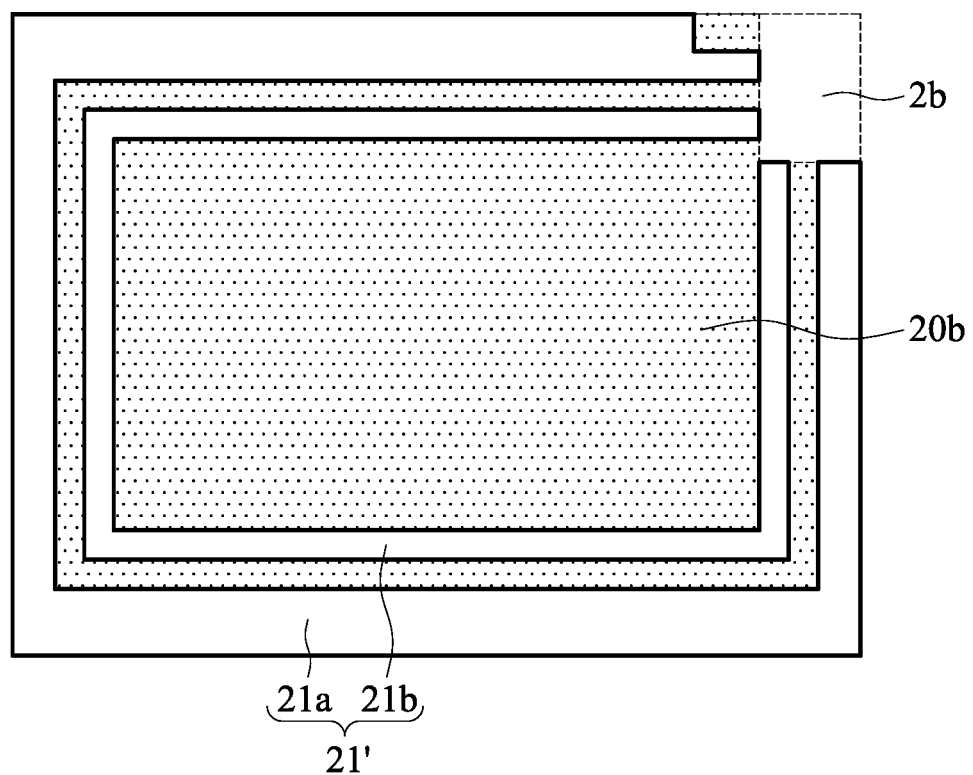

FIG. 2-1 is a schematic perspective view of an electronic device 2 according to the present disclosure. As shown in FIG. 2-1, the electronic device 2 includes a circuit board 2a and at least one antenna module 2b disposed on the circuit board 2a for transmitting and/or receiving radiation signals.

The circuit board 2a includes a circuit board body 20 having a mounting surface 20a and at least one strip-shaped ground circuit 21.

In an embodiment, the circuit board body 20 is a hexahedron, and the mounting surface 20a is in a polygon form. For example, the mounting surface 20a of the circuit board body 20 is a square or rectangular board.

Moreover, the circuit board body 20 includes a base layer structure 20" and an outer layer structure 20' formed on the base layer structure 20". An outer surface of the outer layer structure 20' is served as the mounting surface 20a. The mounting surface 20a is defined with a mounting region A and a functional region B. The mounting region A is arranged with the antenna module 2b, and the functional region B is adjacent to the mounting region A. An inner layer surface of the base layer structure 20" for contacting the outer layer structure 20' is served as a ground surface 20b, and the ground circuit 21 is arranged on a vertical projection region C of the ground surface 20b corresponding to the functional region B. The shape and area of the mounting surface 20a are the same as the shape and area of the ground surface 20b. For example, the mounting region A is located at a corner of the mounting surface 20a.

Furthermore, the ground circuit 21 is arranged on the circuit board body 20 along the edges of the ground surface 20b, and the area of the ground circuit 21 occupying the ground surface 20b (i.e., the area of the ground circuit 21 that covers the vertical projection region C) is at most 50% of the area of the ground surface 20b.

In addition, the ground circuit 21 includes at least one annular body, such as a single annular body shown in FIG. 2-1. Alternatively, referring to FIG. 2-2, a ground circuit 21' has a plurality of looped annular bodies 21a, 21b.

The antenna module 2b is disposed on the mounting surface 20a of the circuit board body 20 and electrically connected to the ground circuit 21, 21' via circuits of the circuit board 2a (not shown). For example, the antenna module 2b is located at the mounting region A at the corner of the mounting surface 20a.

In an embodiment, the antenna module 2b includes a carrier structure having an electronic element and an antenna structure and a packaging layer for encapsulating the electronic element, and the antenna structure is exposed from the packaging layer.

The carrier structure is, for example, a substrate with a core layer and circuit portion, or a coreless substrate with circuit portions, which has an insulator and a circuit layer bonded onto the insulator. The circuit layer is, for example, a fan-out redistribution layer (RDL). The insulator is made of a dielectric material, such as polybenzoxazole (PBO), polyimide (PI), prepreg (PP), etc. It can be understood that the carrier structure can also be other carrier units (such as a lead frame or a silicon interposer) that carry electronic elements (e.g., chips, etc.), and the present disclosure is not limited as such.

The electronic element is a semiconductor chip and disposed on the carrier structure. For example, the electronic element is a semiconductor chip capable of transmitting 5G millimeter waves (5G mmWaves) and is electrically connected to the circuit layer, and the antenna structure receives and transmits the required millimeter waves. It can be understood that the ways in which the electronic element can be electrically connected to the carrier structure are not limited to those described above.

The antenna structure is in an aspect of an antenna frame or an antenna plate to form a coupled antenna or other transmission types.

The packaging layer is made of an insulating material such as polyimide (PI), a dry film, an encapsulant such as an epoxy resin, or a molding compound. The packaging layer can be formed by lamination or molding.

It can be understood that there are many types of the antenna module 2b, which can be designed according to requirements, and are not limited to the above.

Therefore, in the electronic device 2 according to the present disclosure, by adjusting the ground circuit 21, 21' on the circuit board 2a of a system end, the ground circuit 21, 21' occupies at most 50% of the area of the ground surface 20b to improve antenna radiation efficiency of the antenna module 2b, such that the antenna module 2b can continue to be miniaturized and the antenna radiation efficiency can still meet the requirements.

Moreover, the ground circuit 21, 21' is distributed around the circuit board 2a along the edges of the ground surface 20b of the circuit board 2a, which can effectively improve the antenna radiation efficiency of the antenna module 2b.

Figure 3A:
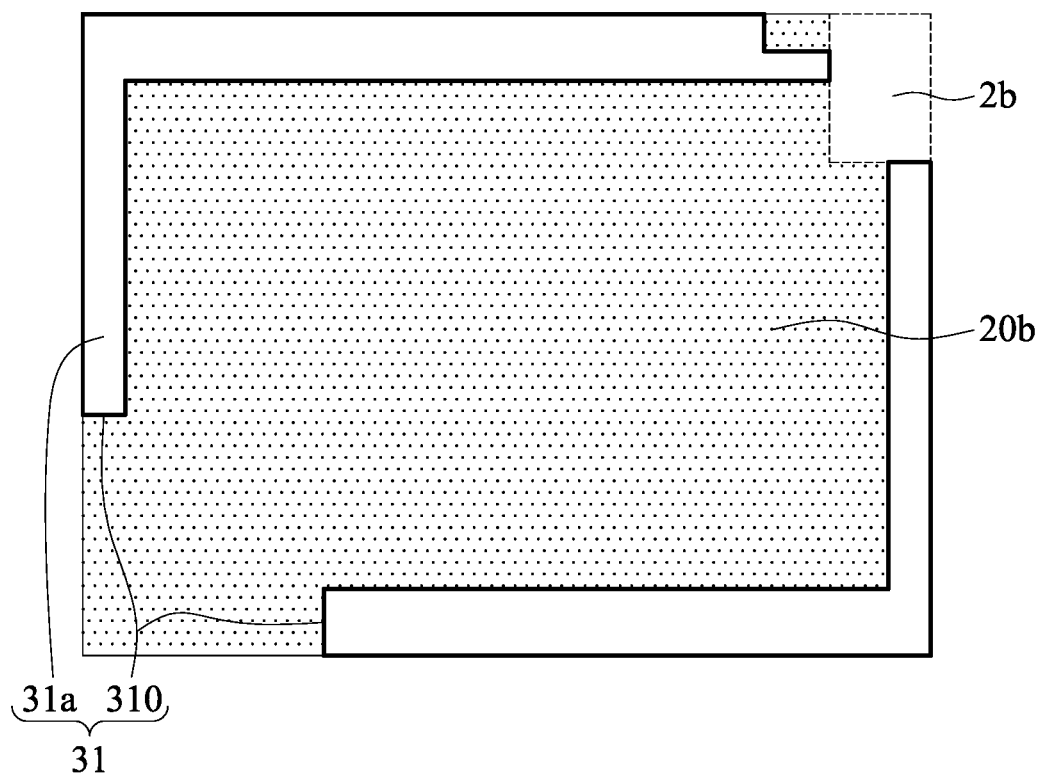
FIG. 3A, FIG. 3B and FIG. 3C are schematic upper plan views showing other embodiments of FIG. 2-1.

Furthermore, an annular body 31a of the ground circuit 31 is formed with a gap 310 (e.g., discontinued section shown in FIG. 3A) to improve radiation efficiency. For example, the gap 310 is located at a corner of the ground surface 20b, that is, the ground circuit 31 is represented by two bent (or L-shaped) wire bodies. Preferably, the location of the antenna module 2b on the mounting surface 20a is not corresponding to the vertical projection at the gap 310, that is, the antenna module 2b and the gap 310 are located at different corners of the circuit board 2a (e.g., the antenna module 2b and the gap 310 are located at opposite corners of the circuit board 2a), such that the location of the antenna module 2b and the location of the gap 310 do not overlap.

Figure 3B:
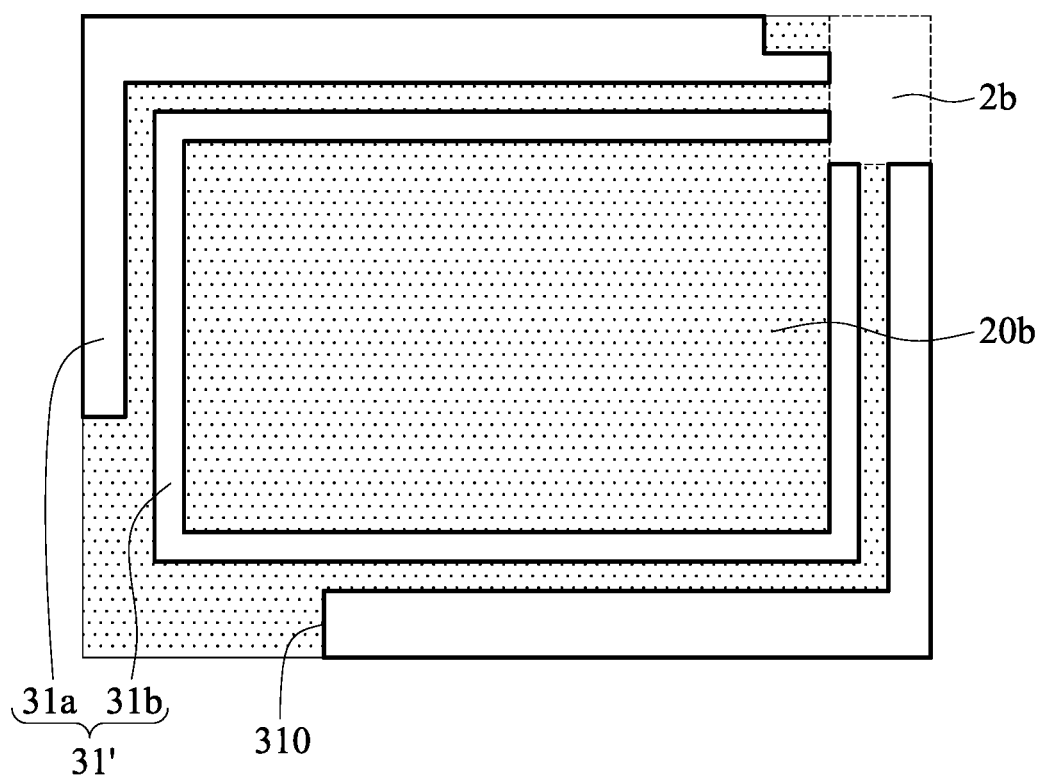
Figure 3C:
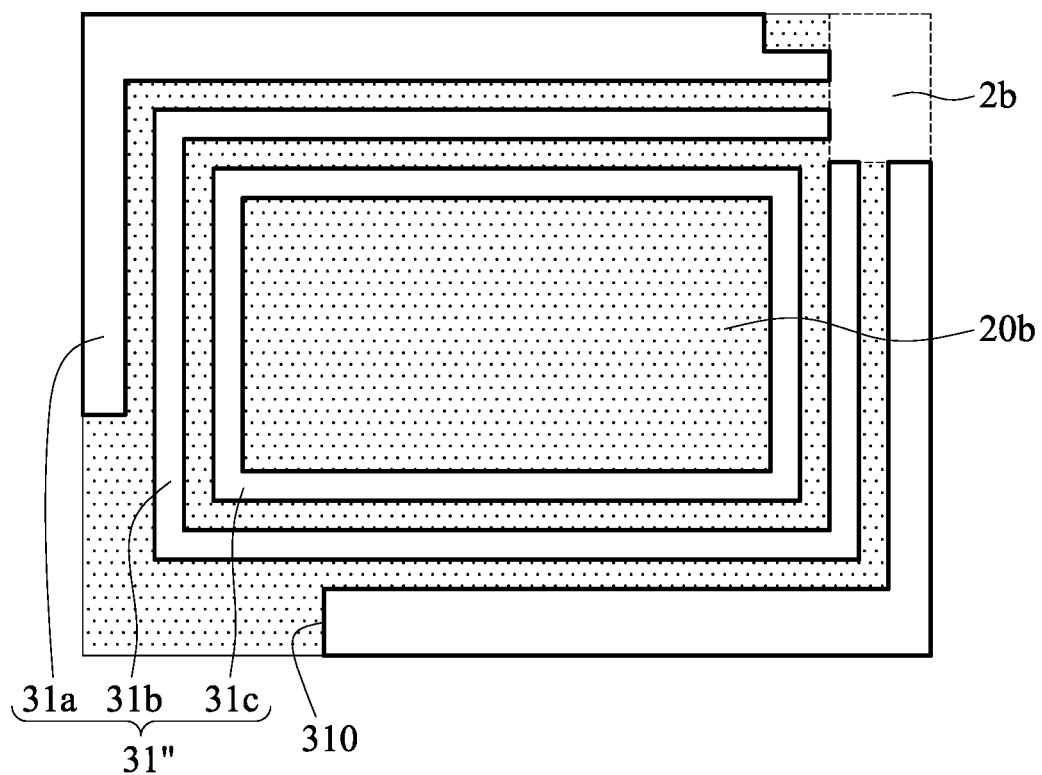

It can be understood that a ground circuit 31' includes the annular body 31a and an annular body 31b (as shown in FIG. 3B), and a ground circuit 31'' includes the annular body 31a, the annular body 31b and an annular body 31c (as shown in FIG. 3C), where at least one annular body 31a is formed with the gap 310.

Therefore, the lower the area occupied by the ground circuit 21 (e.g., the lower the ratio of the area of the ground circuit 21 to the area of the ground surface 20b), the better the radiation efficiency of the antenna module 2b; and when the ground circuits 31, 31', 31'' have a gap 310, the radiation efficiency of the antenna module 2b becomes even better, as shown in Table 1.

TABLE 1

| | An aspect of the prior art (FIG. 1) | An aspect of a single annular body (FIG. 2-1) | An aspect of a single annular body having a gap (FIG. 3A) | An aspect of double annular body having a gap (FIG. 3B) | An aspect of triple annular body having a gap (FIG. 3C) |
|---|---|---|---|---|---|
| Ratio | >50% | 32% | 26% | 45% | 50% |
| Radiation efficiency | 55% | 59% | 72% | 66% | 61% |

Therefore, in the electronic device 2 and the circuit board 2a thereof according to the present disclosure, the ground circuit 21 occupies at most 50% of the area of the ground surface 20b to improve antenna radiation efficiency, so that the antenna module 2b can continue to be miniaturized and the antenna radiation efficiency can still meet the requirements.

In addition, according to a first feature of the present disclosure, the ground circuit 21 is distributed around the circuit board 2a with respect to an axis L of a central axis along the edges of the ground surface 20b of the circuit board 2a, and the area of the ground circuit 21 occupying the area of the ground surface 20b is not greater than 50% of the area of the ground surface 20b so as to improve antenna radiation efficiency; according to a second feature of the present disclosure, the lower the area occupied by the ground circuit 21 (e.g., the lower the ratio of the area of the ground circuit 21 to the area of the ground surface 20b), the better the radiation efficiency; and according to a third feature of the present disclosure, radiation efficiency becomes even better when the ground circuits 31, 31', 31'' have at least one gap 310. Table 2 illustrates the aforementioned three features of the present disclosure in the order of antenna efficiency.

TABLE 2

| Structural design | First feature | First feature plus second feature | First feature plus second feature and third feature |
|---|---|---|---|
| Antenna efficiency | Good | Great | Excellent |

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic device, comprising:
   a circuit board, comprising:
   a circuit board body having an inner layer surface serving as a ground surface; and
   a strip-shaped ground circuit arranged in the circuit board body along edges of the ground surface, wherein the strip-shaped ground circuit occupies at most 50% of an area of the ground surface, wherein the strip-shaped ground circuit includes at least one annular body having a gap, wherein an outer surface of the circuit board is served as a mounting surface; and
   an antenna module disposed on the mounting surface of the circuit board body and electrically connected to the strip-shaped ground circuit, wherein the antenna module is configured to receive and transmit radiation signals.

2. The electronic device of claim 1, wherein the ground surface is in a polygon form, and the gap is located at a corner of the ground surface.

3. The electronic device of claim 1, wherein the antenna module and the gap are located at different locations of the circuit board.

4. The electronic device of claim 1, wherein the mounting surface is in a polygon form, and the antenna module is located at a corner of the mounting surface.

* * * * *